US008930724B2

(12) United States Patent
Jung

(10) Patent No.: US 8,930,724 B2
(45) Date of Patent: Jan. 6, 2015

(54) SEMICONDUCTOR DEVICE PREDICTIVE DYNAMIC THERMAL MANAGEMENT

(75) Inventor: Hwisung Jung, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 121 days.

(21) Appl. No.: 13/303,882

(22) Filed: Nov. 23, 2011

(65) Prior Publication Data

US 2013/0046999 A1   Feb. 21, 2013

Related U.S. Application Data

(60) Provisional application No. 61/524,538, filed on Aug. 17, 2011.

(51) Int. Cl.
*G06F 1/00* (2006.01)
*G06F 1/32* (2006.01)
*H01L 23/34* (2006.01)
*G06F 1/20* (2006.01)

(52) U.S. Cl.
CPC .............. *G06F 1/206* (2013.01); *G06F 1/3206* (2013.01); *G06F 1/324* (2013.01); *H01L 23/34* (2013.01); *G06F 1/3296* (2013.01)
USPC .......................................... 713/300; 713/322

(58) Field of Classification Search
USPC ................................................. 713/300–340
See application file for complete search history.

(56) References Cited

U.S. PATENT DOCUMENTS

| 6,415,388 | B1 * | 7/2002 | Browning et al. ............ 713/322 |
| 7,064,994 | B1 * | 6/2006 | Wu .............................. 365/211 |
| 7,373,269 | B2 * | 5/2008 | Furuichi et al. ............... 702/132 |
| 7,461,272 | B2 * | 12/2008 | Rotem et al. .................. 713/300 |
| 7,603,575 | B2 * | 10/2009 | Woodbridge et al. ......... 713/322 |
| 8,804,338 | B2 * | 8/2014 | Nagasawa ..................... 361/704 |
| 2003/0206050 | A1 * | 11/2003 | Huard et al. .................. 327/540 |
| 2004/0037346 | A1 | 2/2004 | Rusu et al. |
| 2005/0289376 | A1 * | 12/2005 | Hartman et al. .............. 713/320 |
| 2006/0049843 | A1 * | 3/2006 | Jenkins et al. ................ 324/765 |
| 2006/0122740 | A1 * | 6/2006 | Law et al. ..................... 700/300 |
| 2006/0139099 | A1 * | 6/2006 | Osborn ......................... 330/289 |
| 2006/0174146 | A1 * | 8/2006 | Prosperi et al. .............. 713/320 |
| 2007/0006005 | A1 * | 1/2007 | Wyatt et al. .................. 713/320 |

(Continued)

FOREIGN PATENT DOCUMENTS

| CN | 102576625 A | * | 7/2012 | ............. H01H 47/00 |
| JP | 2008082952 A | * | 4/2008 | ............... G01L 9/00 |

(Continued)

OTHER PUBLICATIONS

European Search Report for EP Application No. EP 12 00 5601, European Patent Office, The Hague, Netherlands, mailed on Jan. 18, 2013.

(Continued)

*Primary Examiner* — Faisal M Zaman
(74) *Attorney, Agent, or Firm* — Sterne, Kessler, Goldstein & Fox PLLC

(57) ABSTRACT

A semiconductor device includes a memory storing a lookup table including stored values associated with modes of operation of a component of the semiconductor device. A monitor monitors an operating parameter of the component in real-time, and reports a calculated value associated with the same. A power manager determines a change in the mode of operation of the component based on a comparison of the calculated value with a corresponding stored value, and adjusts a current mode of operation of the component in real-time.

22 Claims, 3 Drawing Sheets

(56) References Cited

U.S. PATENT DOCUMENTS

| | | | |
|---|---|---|---|
| 2007/0067136 A1* | 3/2007 | Conroy et al. | 702/130 |
| 2008/0018374 A1* | 1/2008 | Fujii | 327/291 |
| 2008/0077348 A1* | 3/2008 | Hildebrand et al. | 702/117 |
| 2009/0160472 A1* | 6/2009 | Segawa et al. | 324/760 |
| 2010/0131120 A1 | 5/2010 | Lewis et al. | |
| 2010/0145895 A1* | 6/2010 | Narendra et al. | 706/12 |
| 2011/0055605 A1* | 3/2011 | Jackson | 713/320 |
| 2012/0110352 A1* | 5/2012 | Branover et al. | 713/300 |

FOREIGN PATENT DOCUMENTS

| | | | | |
|---|---|---|---|---|
| JP | 2011114152 A | * | 6/2011 | H01L 27/04 |
| JP | 2012028520 A | * | 2/2012 | H01L 23/36 |
| JP | 5407808 B2 | * | 2/2014 | H01L 21/822 |

OTHER PUBLICATIONS

European Search Report for EP Application No. EP 12 00 5601, The Hague, Netherlands, mailed on Jan. 18, 2013.

* cited by examiner

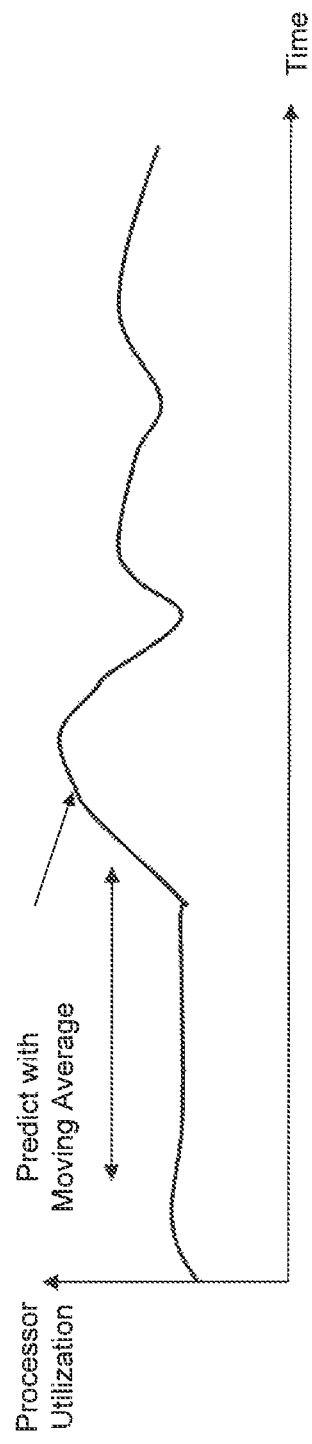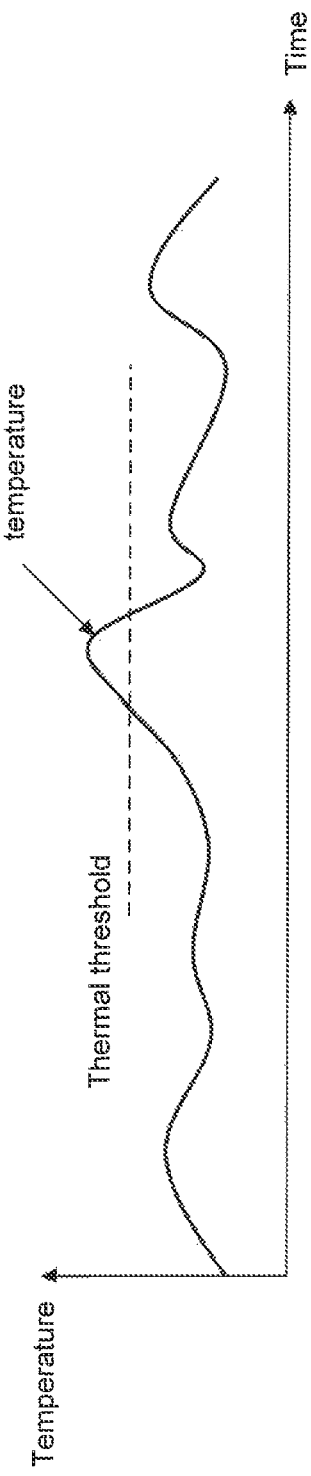
FIG. 1A
FIG. 1B

US 8,930,724 B2

SEMICONDUCTOR DEVICE PREDICTIVE DYNAMIC THERMAL MANAGEMENT

CROSS REFERENCE TO RELATED APPLICATIONS

This patent application claims the benefit of U.S. Provisional Patent Application No. 61/524,538, filed Aug. 17, 2011, entitled "Power Management Unit," which is incorporated herein by reference in its entirety.

BACKGROUND OF THE INVENTION

1. Field of the Invention

The present invention is directed to a system and a method for controlling temperature of semiconductor devices that use system-on-chip (SOC) solutions. In particular, the present invention is directed to the use of predictive and dynamic thermal management techniques to control temperature of the semiconductor devices.

2. Background Art

Advances in designs of mobile application processors have resulted in these processors operating at higher frequencies (>2 GHz). At higher frequencies, processors generate more heat which damages semiconductor devices. Thus, thermal control, at these higher operating frequencies, is a matter of serious concern. Localized heating, in the form of hot spots, is observed in processors operating at higher frequencies (higher switching speeds). These hotspots increase the power density and the thermal vulnerability of the SOC design of the processor. Further, the hotspots cause thermal stress in components leading to increase in the junction temperatures. The increased junction temperatures can increase leakage power and can result in undesirable power-thermal loop. Conventional techniques employed to control temperature are not optimum and there is a need for better temperature control techniques.

One conventional technique is reactive (as opposed to predictive) and relies on thermal throttling to control the temperature. For example, in this reactive technique, a processor is allowed to run at full capacity. When an operating temperature is measured to exceed a thermal limit, the running capacity of the processor is reactively curtailed to reduce the operating temperature of the same. This reactive technique is not optimum because it degrades the performance of the processor and provides a limited time period to prevent a thermal runaway condition. This reactive correction requires a throttling system that is significantly and periodically calibrated.

Another known temperature control technique requires determining a highest performance condition of the processor based on application profile information of a given application, and reactively re-configuring the hardware for thermal safety when the highest performance condition is observed. This technique is not optimum because it is specific to an application, and must be duplicated for every application before being run on the processor. Implementation of this technique during operation can be very complex depending upon the processes required to be run by the application.

As such, there is a need for a better technique for controlling temperature of semiconductor devices that use SOC solutions.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIGS. 1A and 1B illustrate early prediction of a hot spot according to an embodiment of the present invention.

The present invention will be described with reference to the accompanying drawings. The drawing in which an element first appears is typically indicated by the leftmost digit(s) in the corresponding reference number.

DETAILED DESCRIPTION OF THE INVENTION

Figure 2:
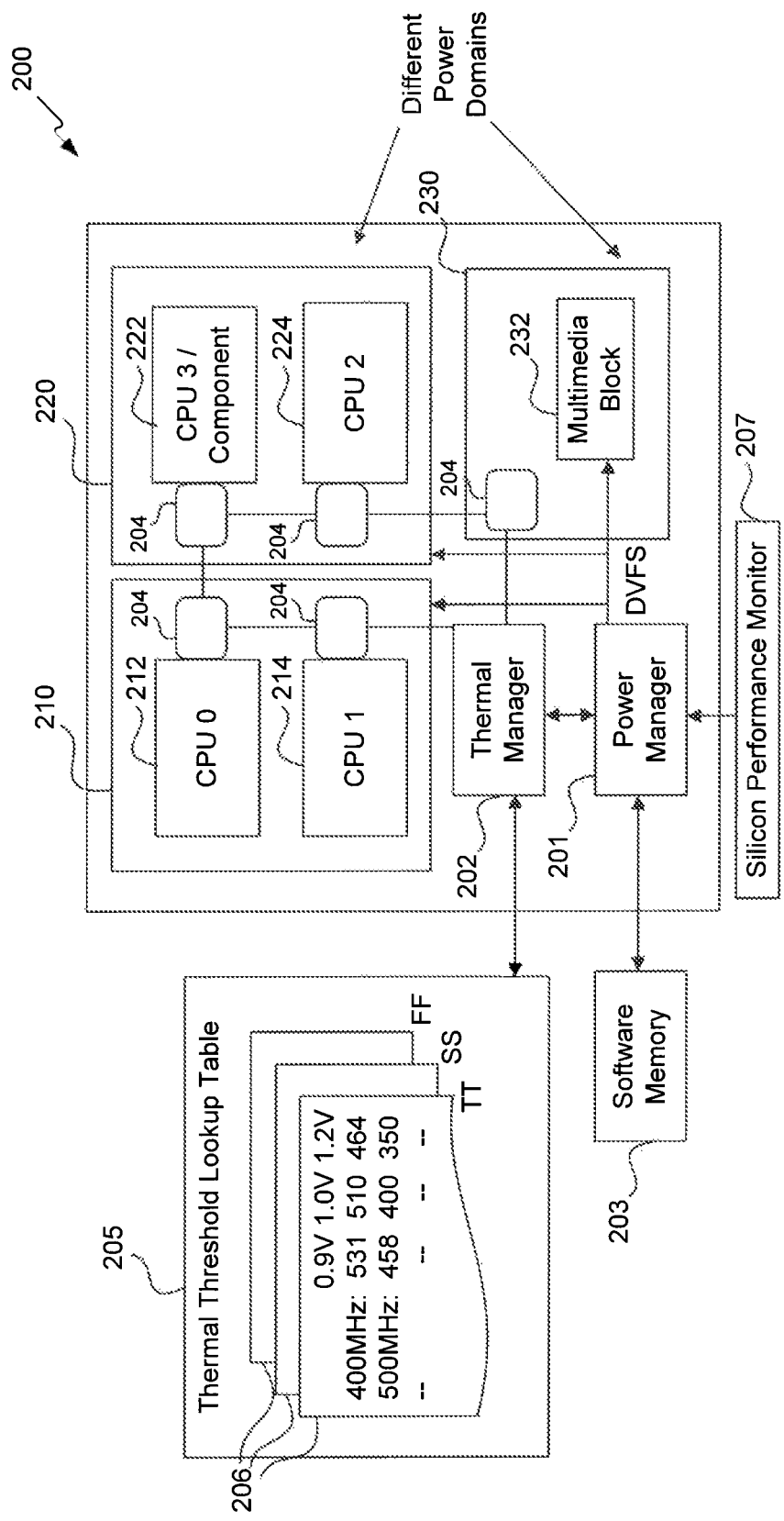
FIG. 2 illustrates the architecture of a SOC temperature control solution according to an embodiment of the present invention.

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Known techniques used to control temperature of semiconductor devices that use SOC solutions are not optimum. Generally, the known techniques are reactive. In contrast, the invention described herein is predictive. Applicant's predictive method assists in minimizing power consumption while satisfying performance constraints. Further, Applicant's predictive method can be applied during operation of the SOC solution (i.e., the processor) to maximize the performance capacity of the same.

In an embodiment, Applicant's technique provides early prediction of possible hot spots and dynamic thermal management. For example, early prediction of possible hot spots can be accomplished by estimating, before and/or during operation, a junction temperature of a component and/or a power state of the SOC solution in advance based on previous junction temperature measurements and/or previous power state measurements. Based on the results of the estimating, the temperature of the semiconductor device can be dynamically managed to maximize performance of the same.

The early hot spot prediction technique will be discussed in further detail. Early hot spot prediction includes predicting locations of potential hot spots on the semiconductor device in advance. Early hot spot prediction can be based on a previous power state of the semiconductor device, on monitoring a temperature associated with the semiconductor device, and/or on a measure of utilization of the processor of the semiconductor device. The measure of utilization could be a measure of time required by the processor to complete a given task.

In an embodiment, time is tracked while the processor is performing multiple tasks (multi-tasking). Time tracking is important because the more the amount of time required to complete a given task, the less the amount of time that can be devoted to other tasks.

Hot spots can be predicted in the following way. Based on the design of the processors in the SOC solution, hot spots can be predicted by choosing the processors that are designed to carry out processor/applications which require more energy. Ring-oscillator based temperature monitors can be placed near such processors designed to use more energy. In addition to placing ring-oscillators near processors, ring-oscillator based temperature monitors can also be placed near components of the semiconductor device such as switching components, multi-media functional block components, and the like, which are designed to expend high energy. The ring-oscillator based temperature monitors can be connected to each other via a ring structure, and can be controlled by a thermal manager (FIG. 2). In an embodiment, the ring-oscillator based temperature monitors are enabled only when certain conditions/thresholds associated with a supply voltage and/or an operating frequency, and/or processor utilization of the processor are met.

FIGS. 1A and 1B graphically illustrate early prediction of a hot spot based on processor utilization of a processor according to an embodiment of the present invention. In particular, FIG. 1A is a graph of processor utilization over time, and FIG. 1B is a graph of corresponding thermal conditions of the processor over time. As the utilization of the processor varies, this variation is monitored and captured. A moving average of this data is computed. A higher temperature can be predicted as the moving average of utilization increases because this means that the processor is starting to expend more energy. This feature is illustrated in FIG. 1B. In particular, a future temperature associated with the processor can be predicted based on a current variation in the utilization of the same. This predicted future temperature can be compared to a threshold temperature value, and the utilization of the processor can be controlled in real time using a power manager or a thermal manager when the future temperature is predicted to exceed the threshold temperature value based on the result of the comparison. In this way, the power manager or the thermal manager can predictively prevent a processor from exceeding a critical threshold temperature. In alternative embodiments, the moving average can be determined based on data captured when monitoring the variation of a supply voltage of the processor and/or an operating frequency of the processor, and/or like parameters of the processor.

Although, early hot spot prediction is generally described herein with respect to a processor, it will be appreciated that early hot spot prediction can be carried out with respect to any component of the semiconductor device. In case of components, a variation in the switching speed of the same may be used to determine the moving average. In case of multimedia functional blocks, an amount of data to be processed and/or a type of data to be processed may be used to determine the moving average. The temperature of a processor or a component can also be measured in real-time and used to predict the future temperature. In another embodiment, the future temperature can also be predicted based on a list of applications cued up to be executed by the processor and respective processor utilization parameters related to the execution of each of the applications.

FIG. 2 illustrates the architecture of an SOC solution according to an embodiment of the present invention. The SOC solution 200 includes a power manager 201, a thermal manager 202, a software memory 203, a memory 205 including lookup tables 206, a silicon performance monitor 207, a power domain 210 including processors, labeled "CPU 0," 212, and "CPU 1," 214 with associated ring-oscillator temperature monitors 204, a power domain 220 including processor "CPU 3," 222, and processor "CPU 2," 224, with associated ring-oscillator temperature monitors 204, and a power domain 230 including multimedia block 232 with associated ring-oscillator temperature monitor 204. Processor 222 can optionally be any component of the SOC solution. The different power domains use, for example, different supply voltages and are used to support different operating frequencies.

The ring-oscillator temperature monitors are placed near recognized hot spots of respective devices, such as processors 212, 214, 222 and 224. In an idle mode, a counter value of each of the ring-oscillator temperature monitors 204 is baselined. The counter values of each of the ring-oscillator temperature monitors 204 with respect to all modes of operations of the associated processors and components (including an idle mode and an active mode) are then pre-calculated and stored in look up tables 206 in memory 205. The counter values are classified according to a process corner (ss, tt, ff), a supply voltage, and an operating frequency associated with each of the processors and components being monitored by the respective ring-oscillator temperature monitors 204. These pre-calculated and pre-stored values correspond to respective operating temperatures of the monitored processors and components. The baselining is based on Applicant's recognition that increase in temperature leads to increase in leakage power. Increase in temperature depends on the process corner within which the processor or component operates. There are three widely used process corners, ss-slow slow; tt-typical typical; and ff-fast fast. Applicant has recognized that leakage power varies at different supply voltages and at different operating frequencies among the different process corners. As such, counter values for each ring-oscillator temperature monitor 204 are pre-calculated with respect to a process corner, a supply voltage, and an operating frequency of the monitored component. These pre-calculated values are stored in lookup tables 206.

The thermal dynamic management will be discussed in further detail. Upon booting up, the silicon performance monitor 207 identifies a process corner associated with each processor 212, 214, 224, and reports the same to the power manager 201. The thermal manager 202 monitors and identifies operating parameters including processor utilization, a switching speed, and/or an amount of data to be processed. In particular, the thermal manager 202 reads the counter values reported by each of the ring-oscillator temperature monitors 204, and converts the same in terms of the above operating parameters. Finally, the power manager 201 reads the converted values from the thermal manager 202. The power manager 201 may read these converted counter values every time a new application runs on the processor, or do the same periodically. Then, the power manager 201 checks whether there is a change in operation of the processors and/or the components by comparing the currently read converted values with previously read converted values.

Alternatively, the power manager 201 may compare the currently read converted values with corresponding pre-calculated baseline counter values stored in the lookup tables 206 for each of the ring-oscillator temperature monitors 204. If the result of the comparison shows that there is a variation in the utilization of a processor indicating that the temperature of the processor is increasing, then the power manager 201 predicts a predicted future temperature of that processor.

The power manager 201 then compares the predicted future temperature with a temperature threshold associated with that processor. If the result of the comparison indicates that the predicted future temperature is greater than or equal to the temperature threshold value, then the power manager 201 controls the operation of the processor to avoid undesirable conditions such as excessive leakage current and also thermal runaway. The controlling the operation of the processor includes the power manager 201 dynamically scaling the operating voltage and/or the operating frequency of the processor. In particular, the power manager 201 may scale the operating voltage and/or the operating frequency based on the baseline values stored in the lookup tables 206, thereby enabling the processor to operate within a desired mode. Optionally, the power manager 201 may halt operation of the processor permanently, or do the same for a given period of time.

When the above architecture is applied with respect to a component 222, the operating parameter monitored and identified could be, for example, a switching speed of the component. When the architecture is applied with respect to the multimedia block 232, the sensed parameter could be, for example, an amount of data to be processed and/or a type of data to be processed.

In this way, the future temperature associated with the processors 212, 214, 224 and/or components 222, 232 can be predicted. These predicted future temperatures can then be used to control the operation of the processors 212, 214, 224 and/or the components 222, 232 to prevent undesirable conditions, as discussed above.

The comparison of the currently read converted values from the thermal manager 202 with corresponding baseline values stored in the lookup tables 206 will now be discussed in brief. As the temperature of the monitored processor increases, the counter value of the associated ring-oscillator temperature monitor 204 decreases. This is because, as the temperature increases, a dynamic current associated with the processor (or a switching current associated with the switching component) decreases. This is because the counter value has a direct proportional relationship with the dynamic current and an inverse proportion relationship with the temperature. As such, when the currently read converted value is smaller than the corresponding stored baseline value, then the power manager 201 may decide to lower the operating voltage and/or the operating frequency of the processor. One will appreciate that the power manager 201 may dynamically adjust only the operating voltage or only the operating frequency of the processor.

Figure 3:
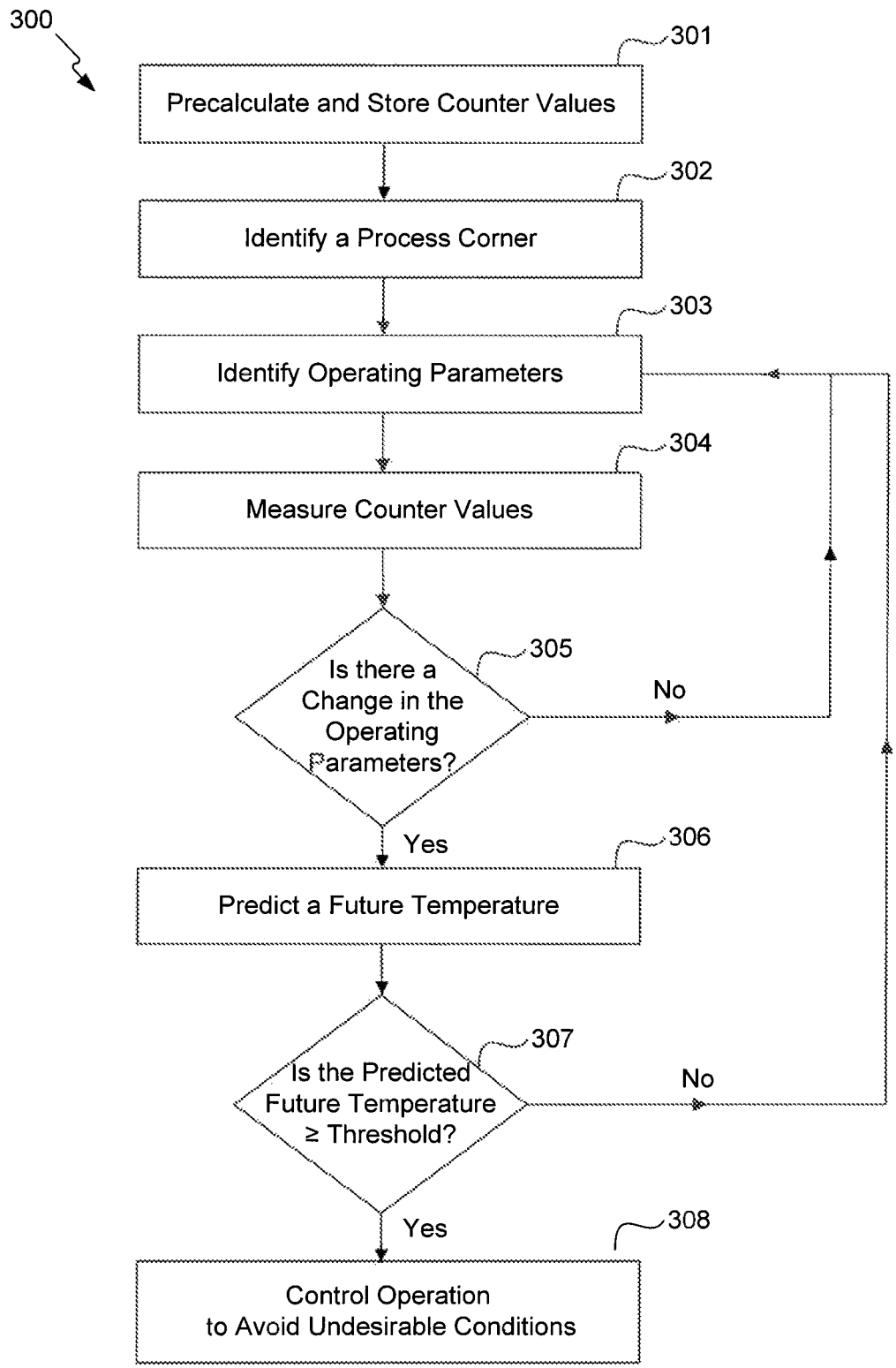
FIG. 3 is a flow chart of an exemplary method performed by the semiconductor device according to an embodiment of the present invention.

FIG. 3 is a flow chart of a method 300 carried out by the architecture shown in FIG. 2. In step 301, baseline counter values corresponding to temperatures of each of the monitored processors 212, 214, 224 and components 222, 232 are pre-calculated and stored. These baseline counter values are classified according to a process corner, an operating supply voltage, and an operating frequency associated with each of the monitored processors 212, 214, 224 and the components 222, 232. In step 302, a process corner within which each of the processors 212, 214, 224 and the components 222, 232 is operating is identified. In step 303, operating parameters associated with each of the processors 212, 214, 224 and the components 222, 232 are identified. These identified operating parameters include processor utilization, a switching speed, and/or an amount of data to be processed. In step 304, counter values from each ring-oscillator temperature monitor associated with each of the processors 212, 214, 234 and the components 222, 232 are measured. In step 305, it is checked whether there is a change in operation of the processors and/or the components based on a comparison of the measured counter values with previously measured counter values. The comparison may alternatively or optionally include monitoring a variation in operation of the processors and/or the components and capturing the same as a moving average, as discussed in FIG. 1. If the result of the comparison is "No," then the process moves to step 303. However, if the result of the comparison is "Yes," then the process moves to step 306. In step 306, a future temperature of the processor and/or the component is predicted. This prediction can be based on previous power states of the processor and/or the component including historical temperatures observed in relation to a voltage, frequency, or utilization. In step 307, the predicted future temperature is compared to a threshold temperature value. If the result of the comparison indicates that the predicted future temperature is greater than or equal to the threshold temperature value, then the process moves to step 308. Otherwise, the process moves to step 303. In step 308, the operation of the processor and/or the component is controlled to avoid undesirable conditions such as excessive leakage current and also thermal runaway. The controlling the operation of the processor includes the power manager 201 dynamically scaling the operating voltage and/or the operating frequency of the processor. Optionally, the power manager 201 may halt operation of the processor permanently, or do the same for a given period of time.

In semiconductor manufacturing, a "process corner" refers to a variation of fabrication parameters used in applying an integrated circuit design to a semiconductor wafer. Process corners represent the extremes of these parameter variations within which a circuit that has been etched onto the wafer must function correctly. A circuit running on devices fabricated at these process corners may run slower or faster than specified and at lower or higher temperatures and voltages, but if the circuit does not function at all at any of these process extremes, the design is considered to have inadequate design margin.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It should be noted that any exemplary processes described herein can be implemented in hardware, software, or any combination thereof. For instance, the exemplary process can be implemented using computer processors, computer logic, application specific integrated circuits (ASICs), digital signal processors (DSP), etc., as will be understood by one of ordinary skill in the arts based on the discussion herein.

Moreover, any exemplary processes discussed herein can be embodied by a computer processor or any one of the hardware devices listed above. The computer program instructions cause the processor to perform the processing functions described herein. The computer program instructions (e.g., software) can be stored in a computer useable medium, computer program medium, or any storage medium that can be accessed by a computer or processor. Such media include a memory device such as a computer disk or CD ROM, or the equivalent. Accordingly, any computer storage medium having computer program code that causes a processor to perform the processing functions described herein are with the scope and spirit of the present invention.

The breadth and scope of the present invention should not be limited by any of the above-described exemplary embodiments, but should be defined only in accordance with the following claims and their equivalents.

What is claimed is:

1. A semiconductor device, comprising:
    a memory configured to store a lookup table including stored values associated with modes of operation of a component of the semiconductor device;
    a monitor configured:
        to monitor, in real-time, an operating parameter of the component during a current mode of operation, and
        to report a calculated value of the operating parameter in the current mode of operation; and
    a power manager configured:
        to determine a change in the current mode of operation of the component based on a comparison of the calculated value with a corresponding stored value from the stored values, and
        to adjust, in real-time, the current mode of operation of the component to prevent the operating parameter from reaching the calculated value.

2. The semiconductor device of claim 1, wherein the power manager is further configured to predict a future operating temperature of the component based on the determined change in the current mode of operation and to adjust the determined change in the current mode of operation of the component based on a comparison of the predicted future operating temperature with a temperature threshold.

3. The semiconductor device of claim 2, wherein the power manager is configured to predict the future operating temperature based on a previous temperature measurement of the component in the current mode of operation.

4. The semiconductor device of claim 2, wherein the power manager is configured to predict the future operating temperature only when the determined change in the current mode of operation of the component indicates an increase in a temperature of the component.

5. The semiconductor device of claim 1, wherein the power manager is configured to scale an operating voltage or an operating frequency of the component based on the stored values to adjust the current mode of operation.

6. The semiconductor device of claim 1, wherein the power manager is configured to suspend operation of the component in the current mode of operation for a given period of time to adjust the current mode of operation.

7. The semiconductor device of claim 1, wherein the stored values are classified according to a process corner, a voltage, and a frequency associated with the component and correspond with temperatures associated with the modes of operation of the component.

8. The semiconductor device of claim 1, wherein the monitor comprises:
    a ring-oscillator temperature monitor configured to monitor a temperature of the component.

9. The semiconductor device of claim 1, wherein the monitor is from among a plurality of monitors and the component is from among a plurality of components, the plurality of monitors being configured to monitor operating parameters of the plurality of components and being coupled to each other in a ring structure.

10. The semiconductor device of claim 1, wherein the monitor is configured:
    to monitor a temperature of the component, and
    to calculate the calculated value, in terms of a voltage and a frequency of the component, based on the monitored temperature.

11. A method, comprising:
    storing, in a semiconductor device, a lookup table including stored values associated with modes of operation of a component of the semiconductor device;
    monitoring, in the semiconductor device, an operating parameter of the component in real-time during a current mode of operation;
    reporting, in the semiconductor device, a calculated value of the operating parameter in the current mode of operation;
    determining, in the semiconductor device, a change in the current mode of operation of the component based on a comparison of the calculated value with a corresponding stored value; and
    adjusting, in the semiconductor device, the current mode of operation of the component in real-time to prevent the operating parameter from reaching the calculated value.

12. The method of claim 11, further comprising:
    predicting a future operating temperature of the component based on the determining,
    wherein the adjusting comprises:
        adjusting the determined change in the current mode of operation of the component based on a comparison of the predicted future operating temperature with a temperature threshold.

13. The method of claim 12, wherein the predicting comprises:
    predicting the future operating temperature based on a previous temperature measurement of the component in the current mode of operation.

14. The method of claim 12, wherein the predicting comprises:
    predicting the future operating temperature only when the determined change in the current mode of operation of the component indicates an increase in a temperature of the component.

15. The method of claim 11, wherein the adjusting the current mode of operation comprises:
    scaling an operating voltage or an operating frequency of the component based on the stored values.

16. The method of claim 11, wherein the adjusting the current mode of operation comprises:
    suspending operation of the component in the current mode of operation for a given period of time.

17. The method of claim 11, wherein the storing comprises:
    classifying the stored values according to a process corner, a voltage, and a frequency associated with the component, the stored values corresponding with temperatures associated with the modes of operation of the component.

18. The method of claim 11, wherein the monitoring comprises:
monitoring a temperature of the component via a ring-oscillator temperature monitor.

19. The method of claim 11, wherein the component is from among a plurality of components, and
wherein the monitoring comprises:
monitoring operating parameters of the plurality of components via a plurality of monitors, the plurality of monitors being coupled to each other in a ring structure.

20. The method of claim 11, wherein the monitoring comprises:
monitoring a temperature of the component, and
wherein the reporting the calculated value comprises:
calculating the calculated value, in terms of a voltage and a frequency of the component, based on the monitored temperature.

21. A semiconductor device, comprising:
a memory configured to store a lookup table including stored values associated with modes of operation of a component of the semiconductor device;
a monitor configured:
to monitor a first operating parameter of the component during a current mode of operation,
to calculate a value associated with a second operating parameter, different from the first operating parameter, in the current mode of operation, and
to report the calculated value; and
a power manager configured:
to determine a change in the current mode of operation of the component based on a comparison of the calculated value with a corresponding stored value from the stored values, and
to adjust the current mode of operation of the component in real-time based on a result of the comparison to prevent the second operating parameter from exceeding a threshold value.

22. The semiconductor device of claim 21, wherein the first parameter comprises:
a utilization of the component, and
wherein the second parameter comprises:
an operating temperature of the component.

* * * * *